United States Patent
Abe et al.

(10) Patent No.: US 6,794,585 B2
(45) Date of Patent: Sep. 21, 2004

(54) PRINTED CIRCUIT BOARD HAVING FILLED THROUGHOLE WITH CORNER ROUNDED PORTION AND MANUFACTURING METHOD

(75) Inventors: Shigetoshi Abe, Tokorozawa (JP); Tomoko Kato, Chofu (JP); Yasuo Sato, Mitaka (JP); Takashi Itagaki, Oume (JP); Kenji Matsumoto, Mitaka (JP)

(73) Assignee: Japan Radio Co., LTD, Tokyo (JP)

( * ) Notice: Subject to any disclaimer, the term of this patent is extended or adjusted under 35 U.S.C. 154(b) by 129 days.

(21) Appl. No.: 10/006,547

(22) Filed: Dec. 4, 2001

(65) Prior Publication Data

US 2002/0117331 A1 Aug. 29, 2002

(30) Foreign Application Priority Data

Feb. 28, 2001 (JP) ........................................ 2001-053959

(51) Int. Cl.[7] ................................................ H05K 1/11
(52) U.S. Cl. ........................ 174/264; 174/261; 361/792; 29/847; 29/879; 29/882
(58) Field of Search ......................... 174/261, 262–266; 361/792–795; 29/846, 847, 879, 882

(56) References Cited

U.S. PATENT DOCUMENTS

| | | | |
|---|---|---|---|
| 3,319,317 A | | 5/1967 | Roche et al. |
| 4,563,543 A | * | 1/1986 | Kersuzan et al. ........... 174/257 |
| 5,010,232 A | | 4/1991 | Arai et al. |
| 5,510,580 A | * | 4/1996 | Shirai et al. ................. 174/266 |
| 5,537,740 A | * | 7/1996 | Shirai et al. .................... 29/852 |
| 5,879,787 A | * | 3/1999 | Petefish ....................... 428/209 |
| 5,925,206 A | | 7/1999 | Boyko et al. |
| 6,531,661 B2 | * | 3/2003 | Uchikawa et al. .......... 174/255 |

FOREIGN PATENT DOCUMENTS

| | | |
|---|---|---|
| EP | 0 744 884 | 11/1996 |
| JP | 05 291727 | 11/1993 |
| JP | 05 327227 | 11/1996 |
| JP | 9-148698 | 6/1997 |
| JP | 2000 208891 | 7/2000 |

* cited by examiner

*Primary Examiner*—Kamand Cuneo
*Assistant Examiner*—Jose H. Alcala
(74) *Attorney, Agent, or Firm*—Collard & Roe, P.C.

(57) ABSTRACT

A method includes the steps of forming a first metal foil (82) on a surface of an insulator substrate (1a), drilling, with a thermosetting resin film (84) temporarily fixed to an opposite surface of the substrate, a through hole (86) simultaneously in the first foil, the substrate, and the resin film, simultaneously heating and vacuum-pressing the first foil, the substrate, the resin film, and a second metal foil (87) brought into contact with the resin film to obtain an intermediate board in which a bottom of the through hole is covered with the second foil and has a corner with a corner rounded portion (93) formed by the resin film, and forming a metal plating layer (95) on the first and the second foils, on the bottom and an inner wall of the through hole, and on the corner rounded portion to obtain a final printed wiring board.

3 Claims, 7 Drawing Sheets

PRINTED CIRCUIT BOARD HAVING FILLED THROUGHHOLE WITH CORNER ROUNDED PORTION AND MANUFACTURING METHOD

BACKGROUND OF THE INVENTION

This invention relates to a method of manufacturing a printed wiring board used in an electronic apparatus.

Referring to FIGS. 1A through 1J, description will be made of a method of manufacturing a printed wiring board as a related art.

Referring to FIG. 1A, preparation is made of a printed wiring board 1 having a plurality of interlayer connection holes. The printed wiring board 1 comprises an insulator substrate 1a, a copper plating layer 1b, and a copper foil 1c. The insulator substrate 1a has through holes formed therein as desired. Then, the insulator substrate 1a is subjected to copper plating to form the copper plating layer 1b on both surfaces of the insulator substrate 1a and inside surfaces of the through holes. The copper plating layer 1b formed on the inside surface of each through hole in the insulator substrate 1a has an inner surface defining the interlayer connection hole of the printed wiring board 1. The interlayer connection holes include a large-diameter through hole 2 having a diameter not smaller than the thickness of the printed wiring board 1 and a small-diameter through hole 3 having a diameter smaller than the thickness of the printed wiring board 1. The printed wiring board 1 prepared as mentioned above is an interlayer connection plating printed wiring board. A hole filling process is carried out for each single interlayer connection plating printed wiring board.

Referring to FIG. 1B, the printed wiring board 1 is placed on a printing table 40 in order to carry out the hole filling process using a printing technique. A printing plate or pattern 50 is used to print a hole filling resin (for example, epoxy resin) 9. A squeegee 70 serves to apply the hole filling resin 9. After the printed wiring board 1 is placed on the printing table 40, the printing pattern 50 is put on the printed wiring board 1 and the hole filling resin 9 is applied and spread on the printing pattern 50 covering the printed wiring board 1 by the use of the squeegee 70.

Referring to FIG. 1C, the hole filling resin 9 is applied and spread on the printing pattern 50 by the squeegee 70. Thus, the hole filling resin 9 is filled in the through holes 3 and 2 as filled resins 19 and 20, respectively. After the through holes 3 and 2 are filled with the hole filling resin 9, the printing pattern 50 is removed and the printed wiring board 1 is displaced from the printing table 40.

Referring to FIG. 1D, the printing pattern 50 is removed from the printed wiring board 1 and the printed wiring board 1 is displaced from the printing table 40. In this state, the hole filling resin 9 is cured. In FIG. 1D, a resin residue 100 is formed by a part of the hole filling resin 9 which has been present in an opening portion of the printing pattern 50 upon filling the hole filling resin 9 in the through holes 3 and 2 and is left on a surface of the printed wiring board 1 or which leaks from the periphery of the opening portion of the printing pattern 50. The resin residue 100 also includes a part of the hole filling resin 9 leaking from a gap between the printing pattern 50 and the printed wiring board 1 in the vicinity of open ends of the through holes 3 and 2. The hole filling resin 9 is cured by heating or photocuring. At this time, both of the filled resins 19 and 20 filled in the through holes 3 and 2 and the resin residue 100 are cured together. As a result, protrusions are formed on the surface of the printed wiring board 1. Such protrusions must be removed by polishing or the like.

Referring to FIG. 1E, the surface of the printed wiring board 1 is flattened and smoothed by the use of a polisher 110. In order to remove the protrusions formed on the surface of the printed wiring board 1 due to presence of the resin residue 100 when the hole filling resin 9 is cured and to flatten and smooth the surface of the printed wiring board 1, polishing is carried out by the use of the polisher 110. At this time, the surface of the printed wiring board 1 is also shaved. As a result of polishing, the printed wiring board 1 as a whole is elongated. Since the copper plating layer 1b and the resin residue 100 different in hardness are simultaneously polished, it is difficult to improve the flatness of the printed wiring board 1.

Referring to FIG. 1F, the protrusions are removed by polishing to produce flattened surfaces 130 and 120 of the hole filling resin 9 filled in the through holes 3 and 2 as the filled resins 19 and 20, respectively. In this state, the through holes 3 and 2 may be referred to as filled through holes. Next, the printed wiring board 1 with the filled through holes is subjected to plating (21 in FIG. 1G) in the following manner.

Referring to FIG. 1G, the printed wiring board 1 with the filled through holes is obtained through the above-mentioned steps and is subjected to plating 21. By the plating 21, the flattened surfaces 130 and 120 of the filled resins 19 and 20 on both sides of the printed wiring board 1 are provided with plating layers 22. Thus, on each of the opposite surfaces of the printed wiring board 1, the copper foil 1c, the copper plating layer (interlayer connection plating layer) 1b, and the plating layer 22 are formed to provide a thick layer. Next, a dry film (23 in FIG. 1H) is adhered onto each surface of the printed wiring board 1 with the plating layer 22 formed thereon to determine a wiring pattern of the printed wiring board 1.

Referring to FIG. 1H, the dry film 23 having a desired wiring pattern is adhered to the printed wiring board 1 plated in FIG. 1G. Thus, the wiring pattern of the printed wiring board 1 is determined by the dry film 23 having the wiring pattern designed for the printed wiring board 1. Next, etching (24 in FIG. 1I) is performed to remove a conductive layer 25 (comprising the plating layer 22, the copper plating layer 1b, and the copper foil 1c) except an area where the dry film 23 is attached, as illustrated in FIG. 1I.

Referring to FIG. 1I, the printed wiring board 1 with the dry film 23 attached thereto in FIG. 1H is subjected to the etching 24. The conductive layer 25 comprises the plating layer 22, the copper plating layer 1b, and the copper foil 1c. After the etching 24, a part of the conductive layer 25 which is protected by the dry film 23 is left to form the wiring pattern (connection pad). Because the conductive layer 25 is thick, etching accuracy is degraded. Then, the dry film 23 remaining on the conductive layer 25 is removed as illustrated in FIG. 1J.

Referring to FIG. 1J, the dry film 23 is removed from the printed wiring board 1 subjected to the etching 24 in FIG. 1I to provide the printed wiring board 1 with the through holes filled and the wiring pattern (connection pad) determined. In FIG. 1J, the connection pads are depicted by 34.

Next referring to FIGS. 2 and 3, description will be made of a merit achieved by filling the hole filling resin in the through holes formed in the printed wiring board 1 as illustrated in FIGS. 1A through 1J.

Referring to FIG. 2, a component 32 is mounted on the printed wiring board 1 in which the through holes are not filled. Referring to FIG. 3, the component 32 is mounted on the printed wiring board 1 in which the through holes are filled.

In FIG. 2, the hole filling resin 9 is not filled in the through hole 3 as the filled resin 19. Therefore, a connection pad to connect the component 32 can not be formed on the through hole 3. On the other hand, in FIG. 3, the through hole 3 is filled with the hole filling resin 9 as the filled resin 19. Therefore, a connection pad 34 comprising the copper plating layer 22 can be formed on the filled resin 19 filled in the through hole 3 in such a manner that the connection pad 34 is connected to the copper plating layer 1b of the printed wiring board 1. Then, the component 32 can be mounted on the connection pad 34 located on the through hole 3.

As illustrated in FIG. 3, the connection pad 34 is formed on the through hole 3 with the filled resin 19 buried therein and the component 32 is directly connected to the connection pad 34 located on the through hole 3. In this manner, the wiring distance is shortened and the inductance is reduced as compared with FIG. 2. Thus, the impedance of the printed wiring board 1 is reduced.

As illustrated in FIG. 3, the filled resin 19 is buried in the through hole 3 so that the connection pad 34 can be formed on the through hole 3 and the component 32 can be directly connected to the connection pad 34 on the through hole 3. Thus, as compared with FIG. 2, the wiring distance is shortened and the inductance is reduced so that the impedance of the printed wiring board 1 is reduced. In this method, however, the complicated steps described in conjunction with FIGS. 1A through 1F are required in order to fill the through hole 3 with the filling resin 9 as the filled resin 19. This decreases the efficiency in production. As illustrated in FIGS. 1A through 1G, a metal layer on the surface of the printed wiring board 1 comprises the copper foil, the interlayer connection plating layer, and the pad. Therefore, the metal layer is thick so that patterning accuracy is inferior.

Furthermore, in the method described in conjunction with FIGS. 1A through 1J, the hole filling process must be followed by polishing as described in conjunction with FIGS. 1E and 1F. Therefore, the productivity is inferior and the printed wiring board 1 is heavily damaged.

SUMMARY OF THE INVENTION

It is an object of this invention to provide a method of manufacturing a printed wiring board, which is capable of forming a connection pad on a through hole without carrying out a hole filling process for the through hole.

It is another object of this invention to provide a printed wiring board in which a connection pad can be formed on a through hole without carrying out a hole filling process for the through hole.

According to this invention, there is provided a method of manufacturing a printed wiring board (81), comprising the steps of:

preparing an insulator substrate (1a) having first and second principal surfaces opposite to each other;

forming a first metal foil (82) on the first principal surface;

temporarily fixing a thermosetting resin film (84) to the second principal surface with the thermosetting resin film brought into contact with the second principal surface;

drilling, with the thermosetting resin film temporarily fixed to the second principal surface, a through hole (86) simultaneously in the first metal foil, the insulator substrate, and the thermosetting resin film so that the through hole extends in a direction substantially perpendicular to the first and the second principal surfaces;

simultaneously heating and vacuum-pressing, with a second metal foil (87) brought into contact with the thermosetting resin film after the drilling step, the first metal foil, the insulator substrate, the thermosetting resin film, and the second metal foil to obtain an intermediate printed wiring board in which a bottom (92) of the through hole is covered with the second metal foil and in which the bottom of the through hole has a corner provided with a corner rounded portion (93) formed by the thermosetting resin film so as to protrude from the corner; and forming a metal plating layer (95) on the first and the second metal foils of both sides of the intermediate printed wiring board, on an inner wall of the through hole, on the corner rounded portion, and on an exposed surface of the second metal foil exposed through the bottom of the through hole to obtain a final printed wiring board provided with interlayer connection.

According to this invention, there is also provided an interlayer connection printed wiring board (81) obtained by the steps of:

preparing an insulator substrate (1a) having first and second principal surfaces opposite to each other;

forming a first metal foil (82) on the first principal surface;

temporarily fixing a thermosetting resin film (84) to the second principal surface with the thermosetting resin film brought into contact with the second principal surface;

drilling, with the thermosetting resin film temporarily fixed to the second principal surface, a through hole (86) simultaneously in the first metal foil, the insulator substrate, and the thermosetting resin film so that the through hole extends in a direction substantially perpendicular to the first and the second principal surfaces;

simultaneously heating and vacuum-pressing, with a second metal foil (87) brought into contact with the thermosetting resin film after the drilling step, the first metal foil, the insulator substrate, the thermosetting resin film, and the second metal foil to obtain an intermediate printed wiring board in which a bottom (92) of the through hole is covered with the second metal foil and in which the bottom of the through hole has a corner provided with a corner rounded portion formed by the thermosetting resin film so as to protrude from the corner; and forming a metal plating layer (95) on the first and the second metal foils of both sides of the intermediate printed wiring board, on an inner wall of the through hole, on the corner rounded portion, and on an exposed surface of the second metal foil exposed through the bottom of the through hole.

According to this invention, there is also provided a printed wiring board (81) including:

an insulator substrate (1a) having a first principal surface and a second principal surface opposite to the first principal surface; and a first metal layer (87) formed on the second principal surface;

the insulator substrate having a through hole (86) which is formed therein and extends in a direction substantially perpendicular to the first and the second principal surfaces so that a part of a surface of the first metal layer is exposed as an exposed surface through a bottom (92) of the through hole;

the printed wiring board comprising a second metal layer (95) formed on the first principal surface of the insulator substrate, on an inner wall of the through hole, and on the exposed surface of the first metal layer.

DESCRIPTION OF THE PREFERRED EMBODIMENT

Figure 1A:
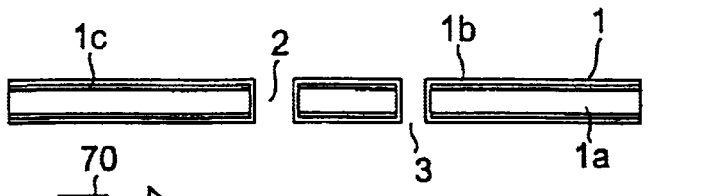
FIGS. 1A through 1J are views for describing a method of manufacturing a printed wiring board according to a related art.
Figure 1B:
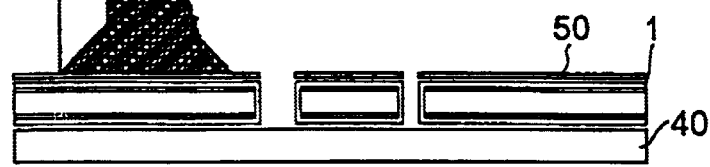
Figure 1C:
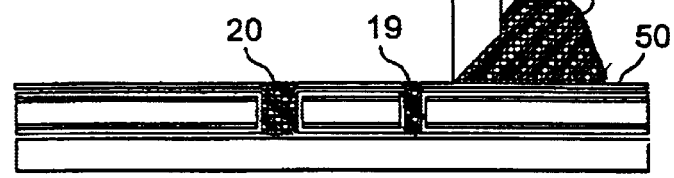
Figure 1D:
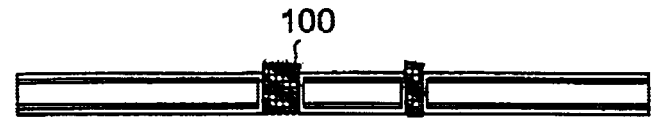
Figure 1E:
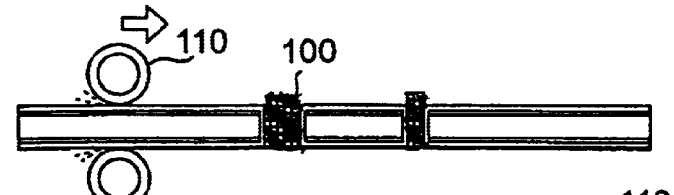
Figure 1F:
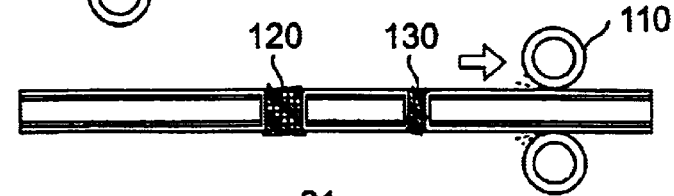
Figure 1G:
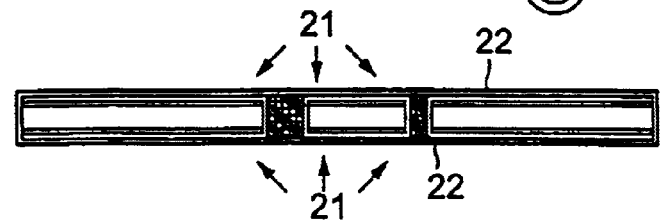
Figure 1H:
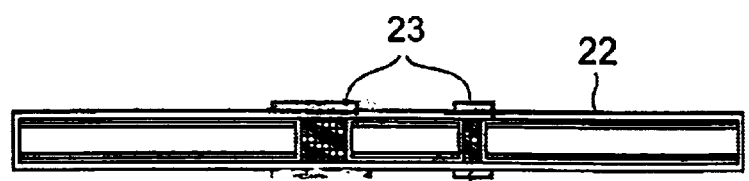
Figure 1I:
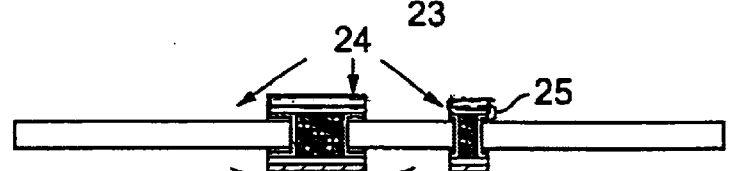
Figure 1J:
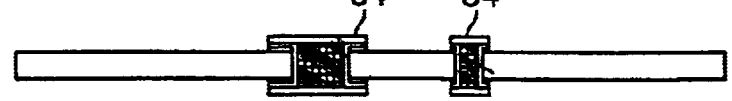

Now, this invention will be described with reference to the drawing.

Referring to FIGS. 4A through 4J, description will be made of a method of manufacturing a printed wiring board according to an embodiment of this invention.

Figure 4A:
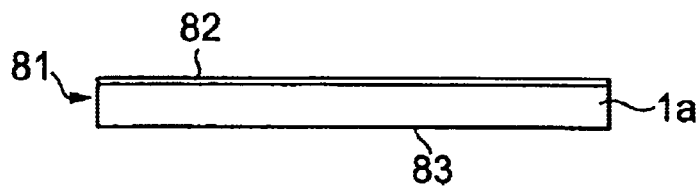
FIGS. 4A through 4J are views for describing a method of manufacturing a printed wiring board according to an embodiment of this invention.

At first referring to FIG. 4A, the printed wiring board 81 comprises an insulator substrate 1a and a copper foil 82 formed on one surface of the insulator substrate 1a. The insulator substrate 1a has the other surface as a substrate resin surface 83 where a resin is exposed. As will be described in the following, a thermosetting resin film (84 in FIG. 4B) is put on the substrate resin surface 83 of the printed wiring board 81 and temporarily or preparatorily fixed.

Figure 4B:
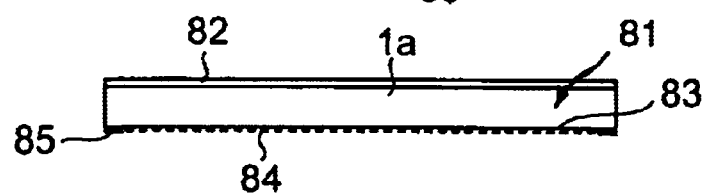

Referring to FIG. 4B, the thermosetting resin film 84 is temporarily fixed to the printed wiring board 81 at temporary fixing portions 85. The thermosetting resin film 84 is low in resin flowability. As illustrated in FIG. 4B, The thermosetting resin film 84 is placed at a base. The printed wiring board 81 is put on the thermosetting resin film 84 so that the substrate resin surface 83 is faced to the thermosetting resin film 84. Next, the temporal fixing portions 85 of the thermosetting resin film 84 are heated or otherwise treated to melt and then solidify the thermosetting resin film 84. As a consequence, the substrate resin surface 83 and the thermosetting resin film 84 are adhered and temporarily fixed. The temporal fixing portions 85 may be located at any desired positions where no wiring or no through hole is present on the printed wiring board 81. At this stage, the thermosetting resin film 84 is unchanged in its state except the temporal fixing portions 85. In other words, the thermosetting resin film 84 has no adhesive effect in an area except the temporal fixing portions 85. Next, a through hole (86 in FIG. 4C) is formed in the printed wiring board 81 and the thermosetting resin film 84 integrally coupled therewith in the following manner.

Figure 4C:
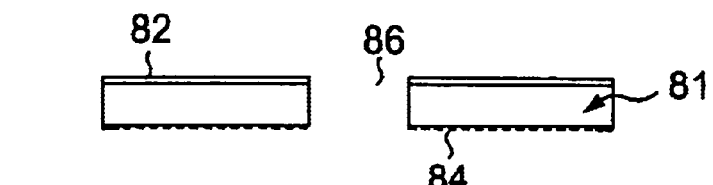

Referring to FIG. 4C, the through hole 86 is formed in the printed wiring board 81 and the thermosetting resin film 84 temporarily fixed thereto. As illustrated in FIG. 4C, the through hole 86 is formed by drilling in the printed wiring board 81 and the thermosetting resin film 84 integrally coupled with each other at the temporal fixing portions 85 in FIG. 4B. As a consequence, through holes equal in diameter and coincident in position are formed in the printed wiring board 81 and the thermosetting resin film 84 to define the through hole 86 of the printed wiring board 81. Next, as illustrated in FIG. 4D, the printed wiring board 81 and the thermosetting resin film 84 with the through hole 86 formed therein are put on a metal foil 87 and assembled together.

Figure 4D:
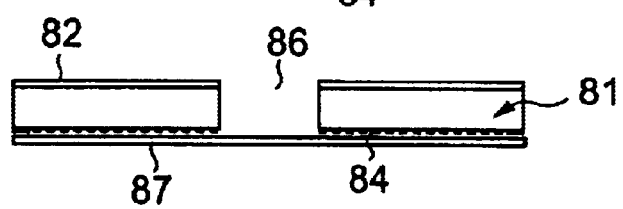

Referring to FIG. 4D, the printed wiring board 81 and the thermosetting resin film 84 with the through hole 86 formed therein as an interlayer connection hole in FIG. 4C are assembled on the metal foil 87 to be subjected to vacuum pressing and heating. As illustrated in FIG. 4D, the metal foil 87, the thermosetting resin film 84, and the printed wiring board 81 are stacked in this order from the bottom. At this stage, the printed wiring board 81 and the thermosetting resin film 84 are temporarily fixed. In the above-mentioned assembling, the printed wiring board 81 with the thermosetting resin film 84 are simply stacked on the metal foil 87 without using any substance having an adhesive effect. Next, a resultant assembly is put into a press to be subjected to vacuum pressing (88 in FIG. 4E) and heating so that the metal foil 87 is adhered.

Figure 4E:
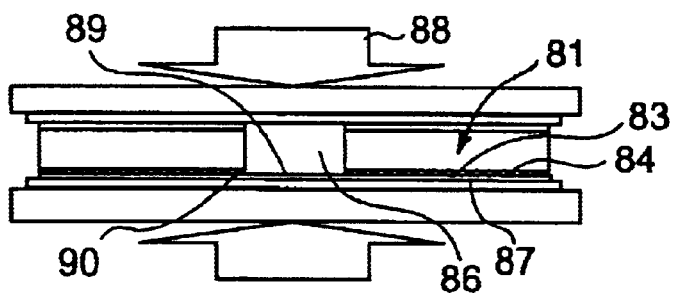

Referring to FIG. 4E, the assembly in FIG. 4D is subjected to the vacuum pressing 88 and the heating. The printed wiring board 81, the thermosetting resin film 84, and the metal foil 87 assembled into a pressable state in FIG. 4D are put into the press to be subjected to the vacuum pressing 88 and the heating. By the heating, the thermosetting resin film 84 is melted so that the substrate resin surface 83 of the printed wiring board 81 is brought into tight contact with the metal foil 87. In the figure, a reference numeral 89 represents a bottom of the through hole 86 formed in the thermosetting resin film 84 and in the printed wiring board 81 to be coincident in position and equal in diameter. The metal foil 87 is exposed at the bottom 89. A reference numeral 90 represents a bottom surrounding portion of the through hole 86. The thermosetting resin film 84 melted by the vacuum pressing slightly leaks to the bottom surrounding portion 90. The thermosetting resin film 84 leaking as mentioned above is poor in resin flowability and therefore stays in the bottom surrounding portion 90 to form a corner rounded portion or a corner R portion (93 in FIG. 4F) without spreading out of the bottom surrounding portion 90. By the heating, the thermosetting resin film 84 adheres the printed wiring board 81 and the metal foil 87 and is solidified. At the bottom surrounding portion 90 of the through hole 86, the thermosetting resin film 84 is solidified to form the corner rounded portion (or the corner rounded portion). Next, the printed wiring board 81, the thermosetting resin film 84, and the metal foil 87 integrally coupled with one another by the vacuum pressing and the heating are removed from the press.

Figure 4F:

Referring to FIG. 4F, the printed wiring board 81 kept in tight contact with the metal foil 87 by the vacuum pressing and the heating in FIG. 4E are removed from the press. The metal foil 87 is exposed at a bottom 92 of the through hole 86. The corner rounded portion (or the corner R portion) 93 is formed by solidification of the thermosetting resin film 84 at the bottom surrounding portion 90 of the through hole 86. The metal foil 87 has an outer surface (a lower surface in the figure) which is flat without irregularities.

The printed wiring board 81 in the state illustrated in FIG. 4F will be referred to as an intermediate printed wiring board.

Next, the intermediate printed wiring board illustrated in FIG. 4F is subjected to plating (94 in FIG. 4G) to provide interlayer connection.

Figure 4G:
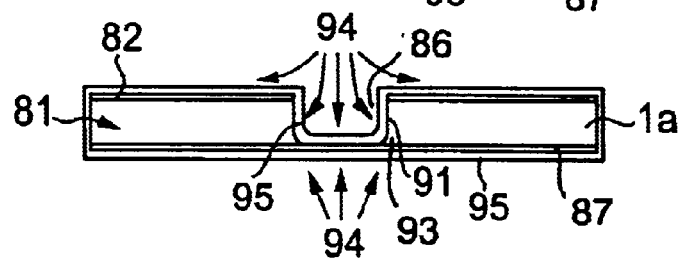

Referring to FIG. 4G, the printed wiring board 81 removed from the press with the metal foil 87 attached thereto as illustrated in FIG. 4F is subjected to the plating (for example, copper plating) 94 to provide interlayer connection. When the printed wiring board 81 with the metal foil 87 adhered thereto is subjected to the plating 94, the copper foil 82 and the metal foil 87 on the printed wiring board 81 are plated. In the through hole 86, circulation of a plating solution is improved by the shape of the corner rounded portion (or the corner R portion) 93 so that a plating layer 95 is formed on an upper surface of the metal foil 87 at the bottom 92 of the through hole 86, on a wall surface 91 of the through hole 86, and on the corner rounded portion (or the corner R portion) 93 of the through hole 86 to thereby complete the interlayer connection.

The printed wiring board 81 in the state where the interlayer connection is completed as illustrated in FIG. 4G will be referred to as a final printed wiring board. The printed wiring board 81 in the state where the interlayer connection is completed as illustrated in FIG. 4G may also be referred to as a closed-hole printed wiring board because the bottom of the interlayer connection hole is closed by the metal.

Referring to FIG. 4G, the printed wiring board 81 in the state where the interlayer connection is completed has a following structure. Specifically, the printed wiring board 81 includes an insulator substrate 1*a* having a first principal surface and a second principal surface opposite to the first principal surface and a first metal layer (87, 95) formed on the second principal surface. The insulator substrate 1*a* has a through hole 86 which is formed therein and extends in a direction substantially perpendicular to the first and the second principal surfaces so that a part of a surface of the first metal layer (87, 95) is exposed as a exposed surface through a bottom of the through hole 86. The printed wiring board 81 further includes a second metal layer (95) formed on the first principal surface of the insulator substrate 1*a*, on an inner wall of the through hole 86, and on the exposed surface of the first metal layer 87. In the illustrated example, a combination of the copper foil 82 and the plating layer 95 is formed on the first principal surface of the insulator substrate 1*a* as the second metal layer.

Next, a dry film (97 in FIG. 4H) having a desired wiring pattern is adhered to the interlayer connection printed wiring board (closed-hole printed wiring board) to determine the wiring pattern of the printed wiring board 81.

Figure 4H:
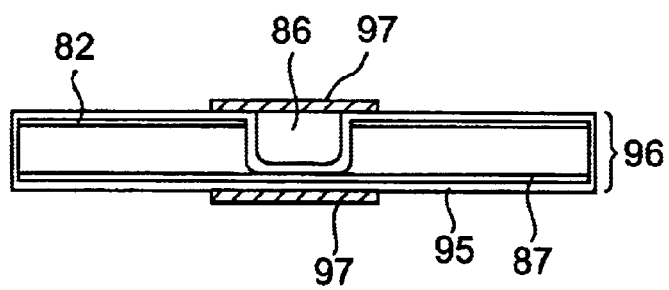

Referring to FIG. 4H, the dry film 97 is adhered to the printed wiring board 81 provided with the interlayer connection in FIG. 4G. The printed wiring board 81 provided with the interlayer connection in the above-mentioned steps is the closed-hole printed wiring board 96. In the closed-hole printed wiring board 96, one side of the through hole 86 as the interlayer connection hole is covered with the metal foil 87 and the plating layer 95 and is flat without irregularities. The dry film 97 has the desired printed pattern. The dry film 97 is adhered to the closed-hole printed wiring board 96 to determine the wiring pattern. Then, etching (98 in FIG. 4I) is carried out to form the wiring pattern of the closed-hole printed wiring board 96.

Figure 4I:
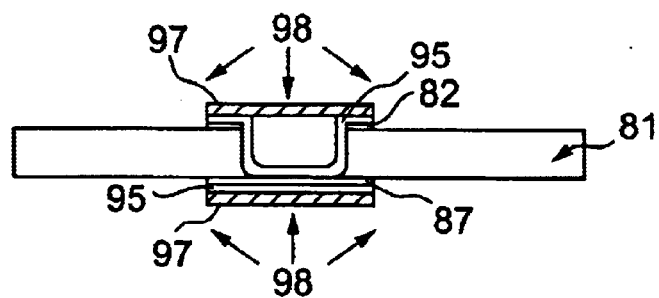

Referring to FIG. 4I, the closed-hole printed wiring board 96 with the dry film 97 attached thereto in FIG. 4H is subjected to the etching 98. By the etching 98, the metal foil 82, the metal foil 87, and the plating layer 95 are removed except those portions protected by the dry film 97 to form the wiring pattern of the closed-hole printed wiring board 96. Next, the dry film 97 is detached.

Figure 4J:
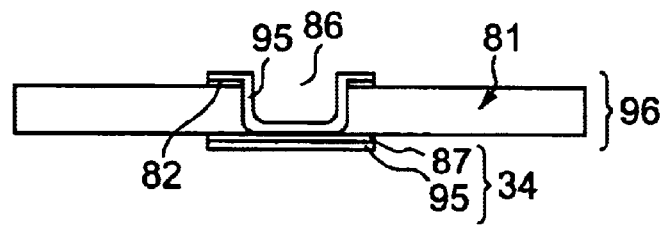

Referring to FIG. 4J, the dry film 97 is detached from the closed-hole printed wiring board 96 subjected to the etching in FIG. 4H. In the closed-hole printed wiring board 96 illustrated in the figure, the dry film 97 is detached and the wiring pattern (connection pad) is completed. In FIG. 4J, the connection pad 34 comprises the metal foil 87 and the plating layer 95.

Figure 2:
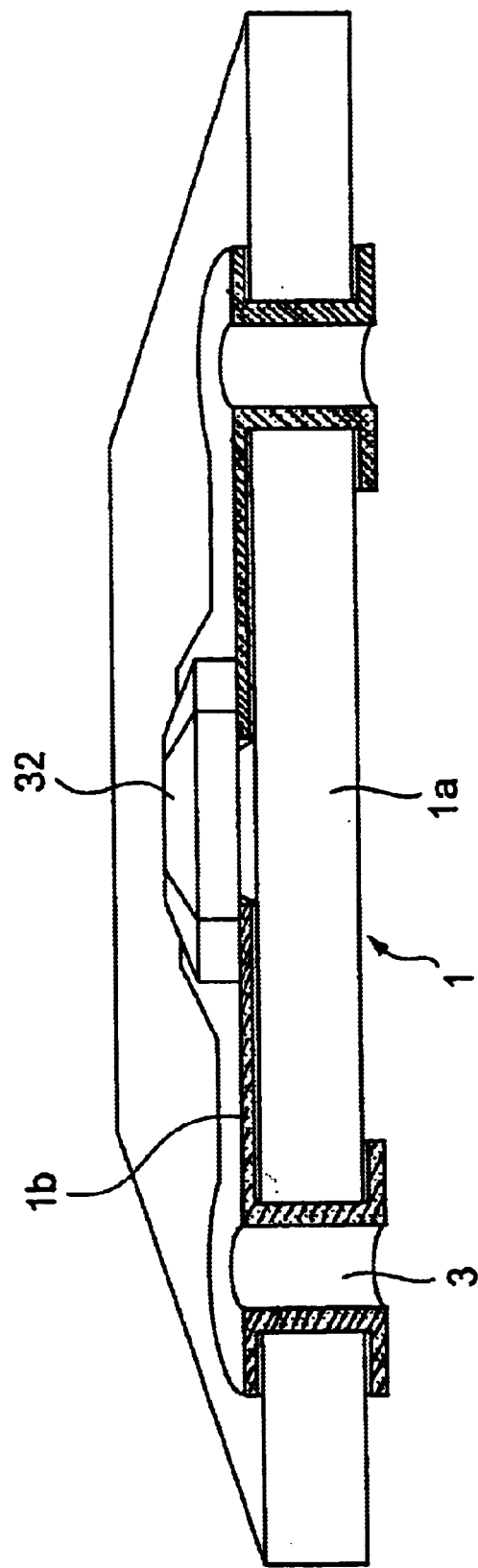
FIG. 2 is a perspective view of a printed wiring board with an interlayer connection hole (through hole) left unfilled and a component mounted thereon.
Figure 5:
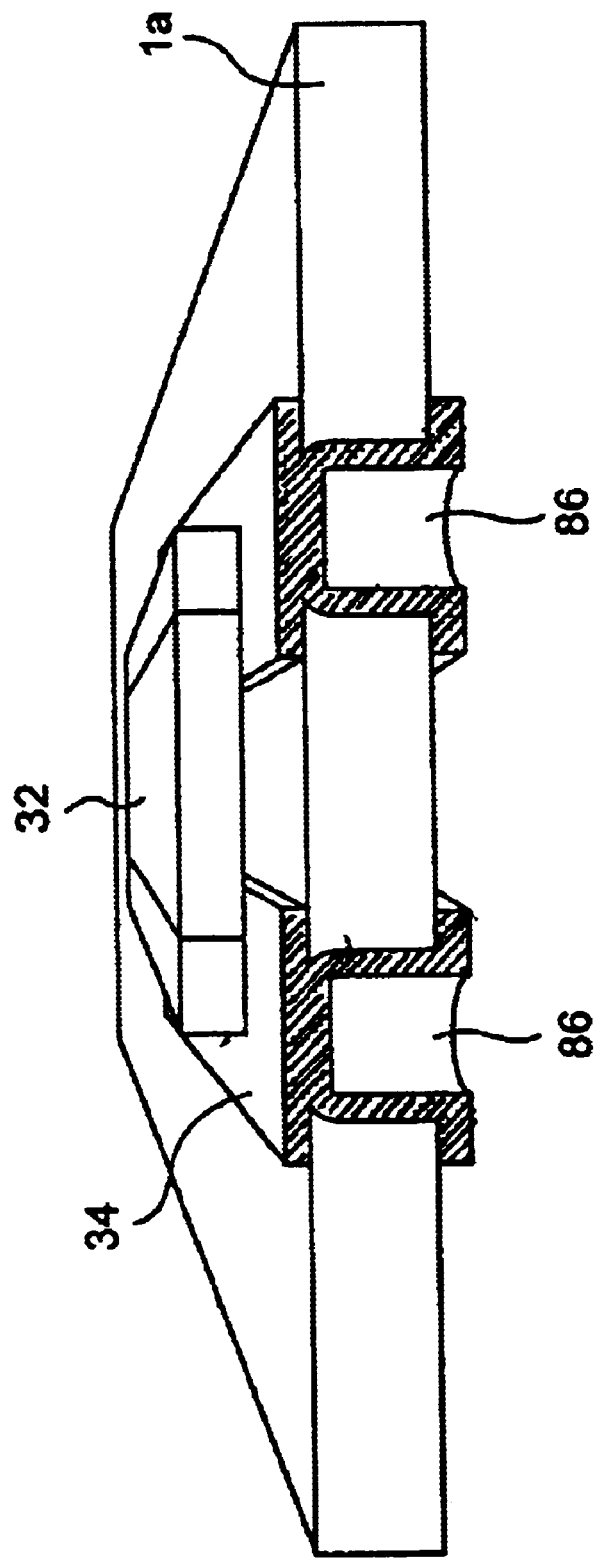
FIG. 5 is a perspective view showing the printed wiring board in FIG. 4J and a component mounted thereon.

Referring to FIG. 5, a component 32 is mounted on the closed-hole printed wiring board 96 according to this invention. The component 32 is directly connected to the connection pad 34 formed on the through hole 86. Therefore, as compared the case where the through hole is not filled as illustrated in FIG. 2, the wiring distance is shortened and the inductance is reduced. Thus, like in the case where the printed wiring board with the through hole filled by the printing technique is used as illustrated in FIG. 3, the impedance of the printed wiring board 81 is reduced.

Figure 3:
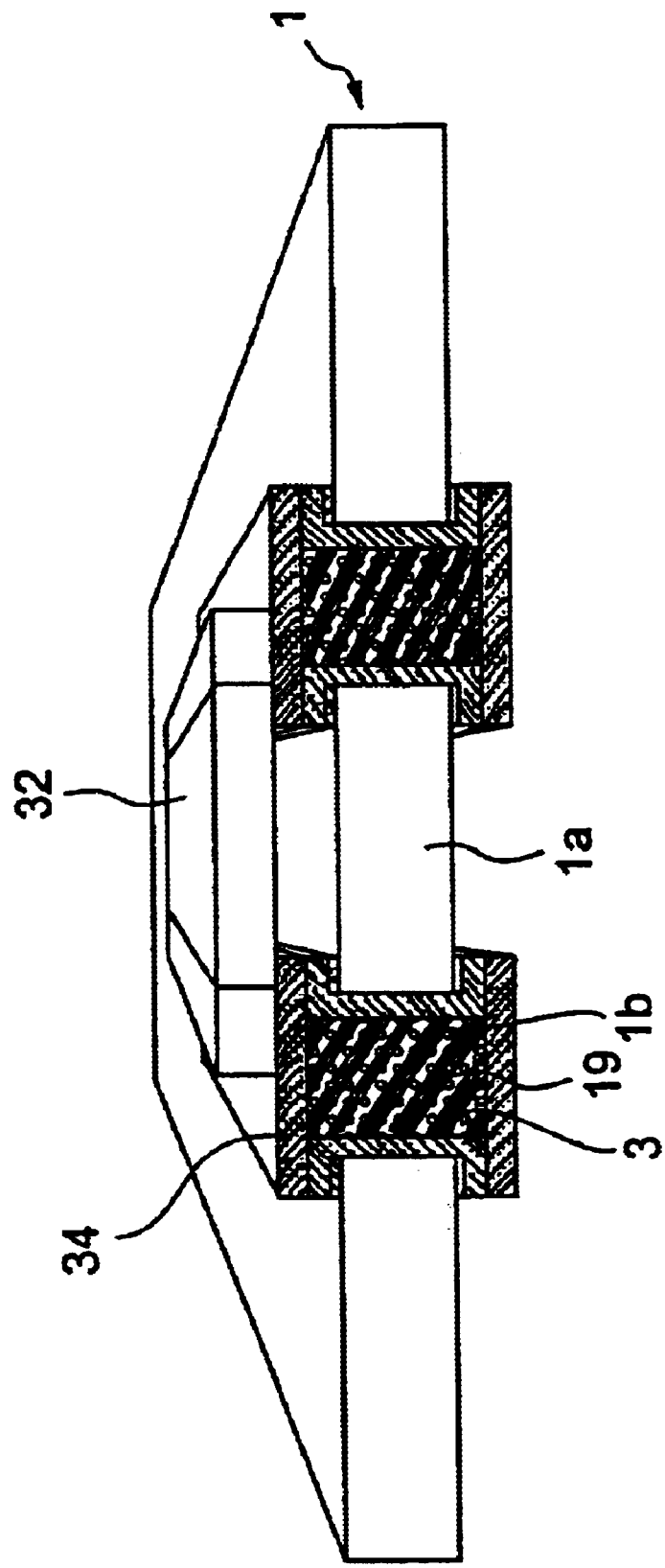
FIG. 3 is a perspective view of the printed wiring board in FIG. 1J after an interlayer connection hole (through hole) is filled and a component mounted thereon.

In the printed wiring board with the through hole filled by the printing technique as illustrated in FIG. 3, the connection pad 34 is formed on the filled resin 19 buried in the through hole. Therefore, mountability of the component 32 depends on the smoothness of the surface of the filled resin 19. On the other hand, in the closed-hole printed wiring board 96 according to this invention, the connection pad 34 in FIG. 5 is obtained by forming the plating layer 95 on the metal foil 87 as illustrated in FIG. 4J. Therefore, no polishing step is required and the smoothness is excellent. The mountability of the component is good and stable.

In this invention, one end (bottom) of the through hole 86 is covered with the metal foil 87 as illustrated in FIG. 4F. Furthermore, the corner rounded portion (or the corner R portion) 93 is formed around the bottom of the through hole 86. Therefore, the plating 94 illustrated in FIG. 4G is improved in coating characteristics to increase the thickness of the plating layer 95 in the through hole 86. Furthermore, by the plating, hole filling by the metal is possible so that the electric resistance can be minimized. As illustrated in FIG. 5, the bottom of the through hole 86 is covered with the metal foil 87 in FIG. 4J. Therefore, no land is required at the pad 34.

As described above, according to this invention, it is possible to manufacture the printed wiring board in which the connection pad can be formed on the through hole without carrying out the hole filling process for the through hole. Thus, the efficiency in production can be improved.

What is claimed is:

1. A method of manufacturing a printed wiring board (81), comprising the steps of:

preparing an insulator substrate (1*a*) having first and second principal surfaces opposite to each other;

forming a first metal foil (82) on said first principal surface;

temporarily fixing a thermosetting resin film (84) to said second principal surface with said thermosetting resin film brought into contact with said second principal surface;

drilling, with said thermosetting resin film temporarily fixed to said second principal surface, a through hole (86) simultaneously in said first metal foil, said insulator substrate, and said thermosetting resin film so that said through hole extends in a direction substantially perpendicular to said first and said second principal surfaces;

simultaneously heating and vacuum-pressing, with a second metal foil (87) brought into contact with said thermosetting resin film after said drilling step, said first metal foil, said insulator substrate, said thermosetting resin film, and said second metal foil to obtain an intermediate printed wiring board in which a bottom (92) of said through hole as covered with said second metal foil and in which the bottom of said through hole has a corner provided with a corner rounded portion (93) formed by said thermosetting resin film so as to protrude from said corner; and forming a metal plating layer (95) on said first and said second metal foils of both sides of said intermediate printed wiring board, on an inner wall of said through hole, on said corner rounded portion, and on an exposed surface of said second metal foil exposed through the bottom of said through hole to obtain a final printed wiring board provided with interlayer connection.

2. An interlayer connection printed wiring board (81) obtained by the steps of:

preparing an insulator substrate (1*a*) having first and second principal surfaces opposite to each other;

forming a first metal foil (82) on said first principal surface;

temporarily fixing a thermosetting resin film (84) to said second principal surface with said thermosetting resin film brought into contact with said second principal surface;

drilling, with said thermosetting resin film temporarily fixed to said second principal surface, a through hole (86) simultaneously in said first metal foil, said insulator substrate, and said thermosetting resin film so that said through hole extends in a direction substantially perpendicular to said first and said second principal surfaces;

simultaneously heating and vacuum-pressing, with a second metal foil (87) brought into contact with said thermosetting resin film after said drilling step, said first metal foil, said insulator substrate, said thermosetting resin film, and said second metal foil to obtain an intermediate printed wiring board in which a bottom (92) of said through hole is covered with said second metal foil and in which the bottom of said through hole has a corner provided with a corner rounded portion formed by said thermosetting resin film so as to protrude from said corner; and forming a metal plating layer (95) on said first and said second metal foils of both sides of said intermediate printed wiring board, on an inner wall of said through hole, on said corner rounded portion, and on an exposed surface of said second metal foil exposed through the bottom of said through hole.

3. A printed wiring board (81) including:

an insulator substrate (1*a*) having a first principal surface opposite to said first principal surface;

a first metal foil (82) formed on said first principal surface; and a second metal foil (87) formed on said second principal surface;

said insulator substrate and said first metal foil having a through hole (86) which is formed therein in said insulator substrate and said first metal foil and extends in a direction substantially perpendicular to said first and said second principal surfaces so that a part of a surface of said second metal foil is exposed as an exposed surface through a bottom (92) of said through hole, the bottom of said through hole having a corner provided with a corner rounded portion (93) formed by a thermosetting resin film so as to protrude from said corner;

said printed wiring board comprising a metal plating layer (95) formed on said first and said second metal foils, on an inner wall of said through hole, on said corner rounded portion, and on said exposed surface of the second metal foil.

* * * * *